United States Patent [19]

Jacoby

[11] 3,953,133
[45] Apr. 27, 1976

[54] METHOD OF DETERMINING THE ANGULAR POSITION OF A WORKPIECE AND APPARATUS THEREFOR

[75] Inventor: Hans-Dieter Jacoby, Werdorf, Germany

[73] Assignee: Ernst Leitz G.m.b.H., Germany

[22] Filed: July 10, 1974

[21] Appl. No.: 487,304

[30] Foreign Application Priority Data
July 11, 1973 Germany............................ 2335227

[52] U.S. Cl. .............................. 356/152; 250/561; 356/110; 356/156; 356/169
[51] Int. Cl.² ........................................ G01B 11/26
[58] Field of Search ........... 356/169, 156, 152, 110, 356/4, 28, 111; 250/561, 571

[56] References Cited
UNITED STATES PATENTS

| | | | |
|---|---|---|---|
| 3,533,702 | 10/1970 | Hock et al. ......................... | 356/169 |
| 3,683,195 | 8/1972 | Johannsmeir et al. ........ | 250/219 DR |
| 3,856,400 | 12/1974 | Hartmann et al. ..................... | 356/28 |

*Primary Examiner*—Maynard R. Wilbur
*Assistant Examiner*—S. C. Buczinski
*Attorney, Agent, or Firm*—Gilbert L. Wells

[57] ABSTRACT

The angular position of a workpiece relative to a reference direction is determined by means of an optical correlator including an imaging system and an optical grating. The workpiece is imaged on the grating and means are provided for effecting a relative lateral displacement between the image and the grating. Photoelectric receiver means are positioned behind the grating in the direction of light flux for generating electrical signals of which the value depends on the angular position of the workpiece relative to the grating. The correlator is rotatable about its optical axis and the electrical signals are of an extreme value when the workpiece and the grooves of the grating are in alignment. Detecting means are connected to the receiver means for sensing this extreme value.

10 Claims, 4 Drawing Figures

METHOD OF DETERMINING THE ANGULAR POSITION OF A WORKPIECE AND APPARATUS THEREFOR

BACKGROUND OF THE INVENTION

The invention relates to a method of orienting the angular position of a workpiece with an optically detectable structure relative to a reference direction.

The method is particularly but not exclusively applicable to the manufacture in the semi-conductor industry of transistors, wherein a plurality of semiconductive elements are deposited successively on a substrate. In such a process, it is often necessary to deposit such semi-conductive elements with a high degree of accuracy and for this purpose masks are frequently employed which shield predetermined portions of the substrate from the means depositing the semi-conductive elements. The method is particularly applicable to the task of accurately and rapidly locating such masks relative to the substrate.

It is known in the semi-conductor industry to adjust masks for the illumination thereby, that one aligns sights on their discrete structures with the aid of split field microscopes and then carries out an orientation by hand or automatically. With regard to an automatic orientation with reference to angular position (rotation) and local position (coordinates $x$ and $y$), it is advantageous initially to undertake the orientation of the angular position and only then the correction of the locality, since then no coupling with the rotation is any longer present, which would require a multi-loop control system. It is an object of the present invention to provide a method and an apparatus for automatically accomplishing the orientation of the angular position.

SUMMARY OF THE INVENTION

The object is attained by a method comprising the steps of imaging such optically detectable feature on to a grating of an optical correlator provided with photoelectric receiver means to receive light from the grating, displacing the grating relative to the image of such feature, and causing the correlator to be angularly displaced about its optical axis relative to the image until electrical signals derived from the receiver means have an extreme value indicative of the workpiece feature extending substantially parallel to the longitudinal dimension of the grating lines.

Preferably, the optical grating is then subjected to an oscillatory linear motion. Advantageously, the imaging optical system and the photoelectric receiver system of the correlator are subjected to an additional oscillation substantially parallel to the grating motion and having a frequency deviating from the grating oscillation. The correlator system can be subjected merely to an oscillatory rotary motion with displaceable zero-point of the oscillation. According to another aspect of the invention there is provided an optical correlator provided with an optical imaging system and with an optical grating, means for effecting relative displacement between the grating and an image of an object having a detectable optical elongate feature imaged on the grating by the imaging system, photoelectric receiver means, and means to detect an extreme value of electrical signals derived from the receiver means, the correlator being rotatably displaceable about its optical axis relative to such object.

BRIEF DESCRIPTION OF THE DRAWINGS

The invention will be more readily comprehended from the following description when taken in conjunction with the appending drawings, wherein.

DESCRIPTION OF THE PREFERRED EMBODIMENT

Figure 1:
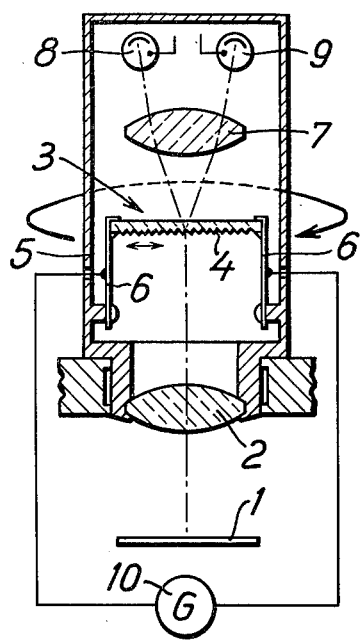
FIG. 1 shows the optical parts of apparatus for orientating a workpiece.

By the reference symbol 1 in FIG. 1 is designated a workpiece as object, the orientation of an optically detectable elongate feature of which is to be determined. The surface of the workpiece 1 section displays structural features which are not shown but which extend substantially perpendicularly to the plane of the drawing. By means of an input optical system represented schematically and indicated by the reference 2 of an optical correlator 3, the workpiece 1 is sharply imaged onto an optical grating or raster 4 of the correlator 3. The grating 4 displays on a transparent carrier a multiplicity of rectilinear furrows, lying next to one another, with triangular cross-section, which extend substantially perpendicularly to the plane of the drawing. Thus, the optical grating 4 is provided with elongate light transmitting window portions. The grating 4 is mounted within the correlator 3 by means of two piezo-electric bender elements 5 and 6 to be movable perpendicularly to the optical axis of the correlator. By means of a second optical system 7, arranged to follow the grating 4 in the correlator 3, the beam splitting surface of the grating 4 is so imaged onto two separate photoelectric receivers 8 and 9, that due to the splitting of light at the grating 4, an image of the surface of the workpiece 1 appears separately on each receiver 8 and 9. The correlator 3 with the component elements described so far is mounted to be rotatable about its optical axis.

The outputs of the photoelectric receivers 8 and 9 are connected to electrical evaluating equipment means, which is not shown in FIG. 1. As such, a rectifier having the faster drive signal as reference is for example suitable.

Due to the relative motion between the image of the object 1 and the grating 4, the light fluxes acting on a respective flank group of the furrows of equal inclination reach the photoelectric receivers 8 and 9 in continuous alternation, so that anti-phase or push-pull signals are generated. Since the object 1 displays optically detectable structural features with a preferential direction, the modulation of these signals is dependent upon the angle between the preferential direction and the line direction of the grating 4. The magnitude of the output signal of the rectifier is thus a measure of how far these two directions agree with one another. The output signal has its maximum value, when the directions are parallel to one another. On the application of the method to the adjustment of masks, the correlator 3 is rotatably displaced about its optical axis until the output signal is at its maximum value and the angular position of the workpiece 1 has thus been determined. In a further development of the invention, the correlator can also additionally carry out a parallel oscillatory motion, the frequency of which has a certain spacing from the oscillation frequency of the furrow raster. The output signal of the mentioned rectifier is then applied to a second phase-sensitive rectifier, the reference input of which is driven by an electrical signal coordinated with the oscillatory motion of the correlator. In this case, the above described maximum seeking, which is always involved in error, is replaced by a phase-sensitive rectification. It will further be possible, in place of the last mentioned proposal, to employ the known methods of the differentiation prior to the phase-sensitive rectification and furthermore, the oscillation of the prism raster may also be dispensed with, when the rotation includes an oscillatory self-movement and the rotary position of maximum modulation change is electronically determined by electronic evaluation circuits which likewise execute differentiations. Further, the use of other correlation optical principles, such as pupil division, or the employment of particularly constructed correlators is also possible.

Figure 2:
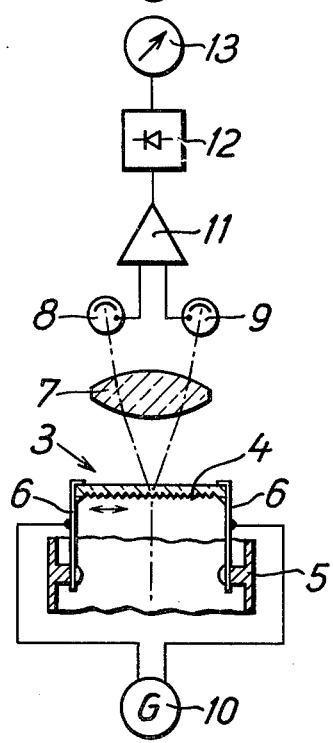
FIG. 2 shows a signal evaluating circuit for the apparatus shown in FIG. 1.

FIG. 2 shows schematically the grating 4 with the piezo-electric elements 6 for the raster motion according to FIG. 1, which are electronically driven by an electrical generator 10. The output signals of the photoelectric receivers 8 and 9 — for the purposes of elimination of components of like phase — applied to a differential amplifier 11, the output signal of which is rectified by means of a rectifier 12 and indicated by measuring instrument 13. The desired angular equality of position between workpiece and reference direction of the raster is in this case characterised by a maximum value of the indication at the instrument 13.

Figure 3:
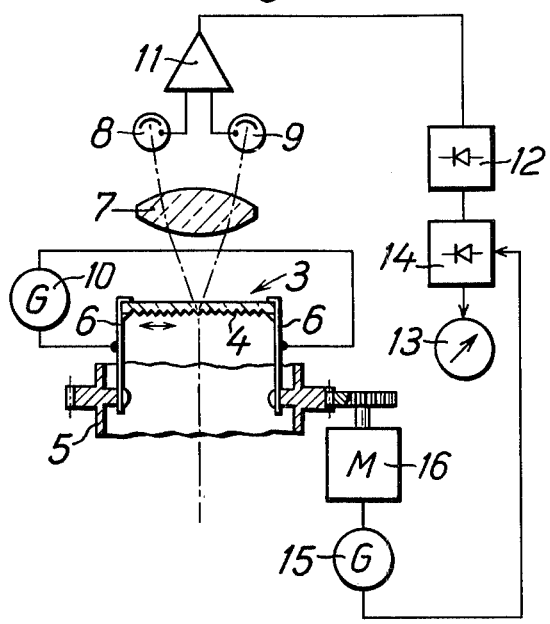
FIG. 3 shows another signal evaluating circuit.

Further apparatus embodying the invention is shown in FIG. 3, which displays by comparison with FIG. 2 additionally to the rectifier 12, a phase-sensitive rectifier 14, which receives its reference signal synchronously from the generator source feeding a motor 16. The motor 16 actuates the correlator system 3 into rotary oscillations. For the remainder, the reference symbols indicate the same component elements as in FIG. 2. The desired angular equality of position between workpiece and reference direction of the raster 4 is in this case given by a minimum value of the output signal of the phase-sensitive rectifier 14, wherein this output signal is indicated at the instrument 13.

Figure 4:
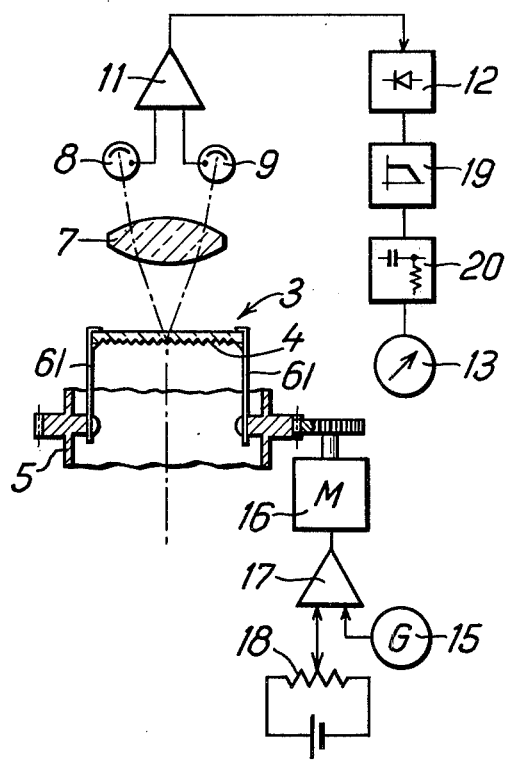
FIG. 4 shows a further signal evaluating circuit.

A still further embodiment is illustrated in FIG. 4. Here, associated with the correlator system 3 is merely a rotary drive motor 16, which is fed through a summing amplifier 17 from an alternating current source 15 and from a direct current source adjustable by means of a potentiometer 18. Thereby, the system 3 experiences an oscillatory rotary motion with a zero point of the oscillation displaceable at constant speed. The electrical signals resulting at the photoelectric receivers 8 and 9 from this rotary motion relative to the workpiece 1 are freed of their uni-directional components at the push-pull amplifier 11, rectified in the rectifier 12, smoothed in a low pass filter 19, differentiated in a differentiating stage 20 connected to follow in the circuit and indicated at the instrument 13. When for the desired angular equality of position, the amplitude at the output of the push-pull amplifier 11 is at its maximum value, then the instrument 13 correspondingly indicates a zero value of the signal differentiated with respect to time.

Thus, the entirety of the object structure is drawn upon for the seeking of information, so that errors, which on the measurement of individual structural features would enter into the adjustment, are not significant.

The method is suitable for the orientation of workpieces with optically detectable structural features. In the case of transparent workpieces, these structures can be distributed in the workpiece, with opaque workpieces however only surface structures are optically effective.

What is claimed is:

1. A method for determining relative to a reference direction the angular position of a workpiece having an optically detectable elongate feature, the method comprising the steps of:

imaging said optically detectable feature by an optical imaging system onto a grating of an optical correlator system defined by at least said one grating having grating lines in an image plane of said optical imaging system as well as at least one photoelectric receiver means associated with said grating and scanning said grating to receive light from said grating;

displacing said grating relative to the image of said optically detectable feature; and angularly displacing said optical correlator system about its optical axis relative to the image, generating electrical signals from said photoelectric receiver means and indicating maximum and minimum values of said signals at the position where said elongate feature extends substantially parallel to said grating lines.

2. A method as claimed in claim 1, wherein the step of displacing the grating comprises the step of subjecting the grating to linear oscillatory motion.

3. A method as claimed in claim 2, comprising the additional step of subjecting the optical imaging system and the receiver means of the correlator to oscillatory motion in a direction substantially parallel to the motion of the grating and at a frequency different from that of the motion of the grating.

4. A method as claimed in claim 1, wherein the correlator is subjected to an oscillatory rotary motion, the zero point of oscillation being displaced at substantially constant speed, unidirectional components of the electrical signals derived from the receiver means being eliminated, and the remaining components of the electrical signals being rectified, smoothed and differentiated to provide said indicating.

5. Apparatus for determining the angular position of a workpiece object relative to a reference direction, the workpiece having an optically detectable elongate feature, the apparatus comprising:

an optical correlator provided with an optical imaging system and with an optical grating having lines;

means for rotatably displacing said correlator about its optical axis relative to said workpiece object;

means for effecting relative displacement between the grating and an image of the workpiece imaged on the grating by the imaging system;

photoelectric receiver means; and means to detect maximum and minimum values of electrical signals derived from the receiver means.

6. Apparatus as claimed in claim 5, wherein said means to detect comprise rectifier means having input means connected to the receiver means and output means connected to signal indicator means.

7. Apparatus as claimed in claim 6, wherein said rectifier means is connected to said signal indicator means via further rectifier means, the further rectifier means being phase-sensitive and having input means for electrical signals coordinated with the rotary motion of the correlator.

8. Apparatus as claimed in claim 6, wherein said rectifier means is connected to said signal indicator means via low pass filter means and differentiating means, said indicator means indicating when the signal derived from the differentiator means has zero value.

9. Apparatus as claimed in claim 6, comprising amplifier means having input means each connected to respective ones of two photoelectric receivers and output means connected to the rectifier means.

10. Apparatus as claimed in claim 9, wherein the amplifier means is a push-pull amplifier.

* * * * *